United States Patent [19]

Nyhus

[11] Patent Number: 4,482,873
[45] Date of Patent: Nov. 13, 1984

[54] PRINTED HYBRID QUADRATURE 3 DB SIGNAL COUPLER APPARATUS

[75] Inventor: Orville K. Nyhus, Melbourne, Fla.

[73] Assignee: Rockwell International Corporation, El Segundo, Calif.

[21] Appl. No.: 419,108

[22] Filed: Sep. 16, 1982

[51] Int. Cl.³ ............................................. H01P 5/18
[52] U.S. Cl. .................................... 333/116; 333/238
[58] Field of Search ................. 333/109, 112, 116, 26

[56] References Cited

U.S. PATENT DOCUMENTS

| | | | |
|---|---|---|---|
| 3,086,178 | 4/1963 | Boyd, Jr. | 333/116 X |
| 3,593,208 | 7/1971 | Smith | 333/116 X |
| 3,629,733 | 12/1971 | Podell | 333/116 |
| 3,723,914 | 3/1973 | Cappucci | 333/112 |
| 4,193,048 | 3/1980 | Nyhus | 333/26 |
| 4,375,054 | 2/1983 | Pavio | 333/116 |
| 4,392,250 | 7/1983 | Hallford | 333/26 X |

*Primary Examiner*—Paul L. Gensler
*Attorney, Agent, or Firm*—Bruce C. Lutz; Robert C. Mayes; H. Fredrick Hamann

[57] ABSTRACT

A printed hybrid quadrature 3 dB signal coupler using discrete components for the capacitive coupling and plated through holes to effect an approximation of twisted wire coupling whereby the completed product occupies much less physical space on a printed circuit board than the normal quarter-wavelength coupler.

3 Claims, 3 Drawing Figures

PRINTED HYBRID QUADRATURE 3 DB SIGNAL COUPLER APPARATUS

THE INVENTION

The present invention is generally related to electronics and more specifically related to electronic signal couplers. Even more specifically, the present invention is related to a printed circuit hybrid signal coupler which utilizes the concept of plated through holes to effect the symmetry of twisted wire coupling in a 3 dB quadrature signal coupler.

Signal splitting and signal combining has been accomplished in the past in various ways. Typically, the coupling is accomplished either with discrete components or with quarter-wavelength printed circuit coupling paths. The lumped element signal couplers have been described in the literature such as an article by R. E. Fisher entitled, "Broadband Twisted-Wire Quadrature Hybrids", found in *IEEE-MTT Transactions,* May 1973, Page 255. Distributed quarter-wavelength couplers are also well-known in the literature, an example being an article by Matthaei, Young, and Jones entitled, "Microwave Filters, Impedance-Matching Networks, and Coupling Structures", published by McGraw-Hill in 1964, Chapter 13. The present inventive concept provides a hybrid device which is small in size, low in parts costs and assembly labor and repeatable in electrical performance.

The present invention uses a printed circuit, distributed (in the context of transmission line theory), coupled pair of inductors on a printed circuit board substrate together with two lumped element capacitors. The printed circuit material is divided into separate portions with plated through holes connecting portions on opposite sides of the board to effect the simulation of a twisted wire coupling device.

An object of the present invention is to reduce the size of the coupler from that required by distributed component quarter-wavelength couplers.

A further object of the invention is to decrease the parts cost and lower assembly labor time as compared to all lumped element component couplers.

Other objects and advantages of the present invention may be ascertained from a reading of the specification and appended claims in conjunction with the drawings wherein:

DETAILED DESCRIPTION

Figure 1:
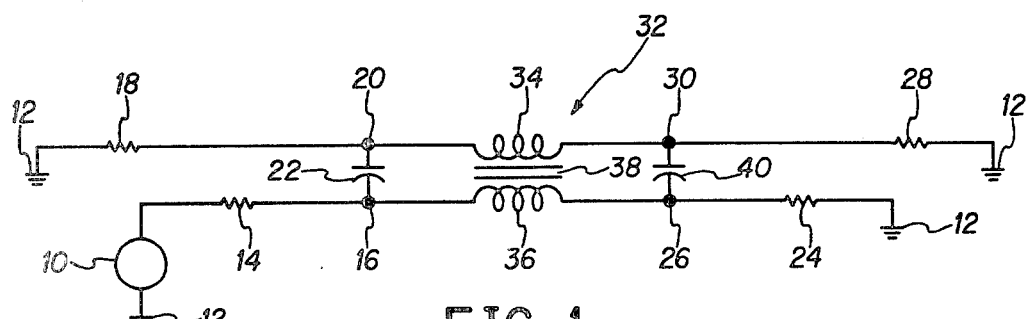
FIG. 1 is a schematic diagram of a 3 dB quadrature signal coupler.

In FIG. 1 a signal generating source 10 is shown connected between ground 12 and one end of an impedance or resistive element 14 which has its other end connected to a junction point 16. A further impedance or resistive element 18 is connected between ground 12 and a junction point 20. A capacitor 22 is connected between junction points 16 and 20. A further resistive or impedance element 24 is connected between a junction point 26 and ground 12 while a final resistive or impedance element 28 is connected between a junction point 30 and ground 12. An inductive element generally designated as 32 has a first winding 34 having its ends connected between junction points 20 and 30 while a second winding 36 has its ends connected between junction points 16 and 26. The two windings 34 and 36 are inductively coupled as figuratively indicated by inductive coupled means or core 38. The inductive coupling need not be magnetic material but may be any material between which magnetic coupling occurs wherein said magnetic coupling is completely separate from electric coupling. Finally, in FIG. 1, a capacitor 40 is shown connected between junction points 26 and 30.

Figure 2:
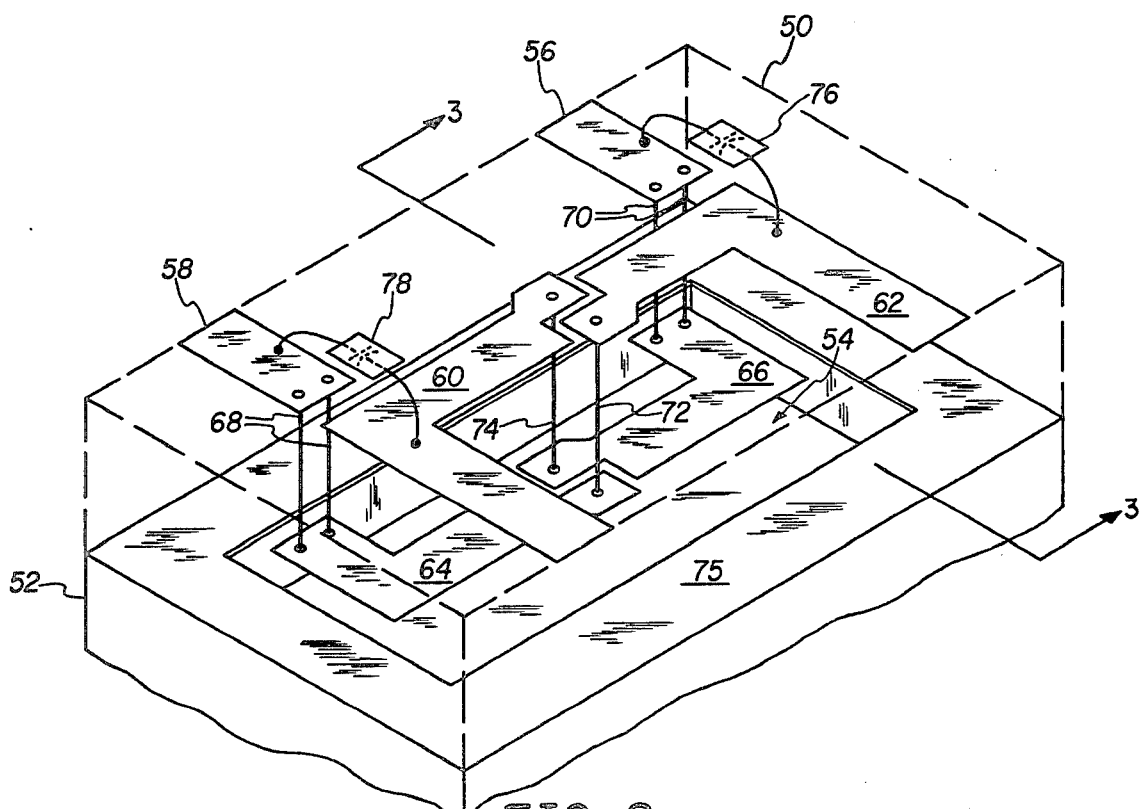
FIG. 2 is an isometric view of one embodiment of the inventive concept for the inductive and capacitive coupling portion of FIG. 1.

In FIG. 2, a dielectric 50 is shown attached to a ground plane or other metal means 52 having a cutout portion 54 contained therein. Attached to dielectric 50 are several pieces of plated material or printed circuit portions such as 56, 58, 60 and 62 on one side of the dielectric 50 with portions or elements 64 and 66 on the opposite side of dielectric 50. A pair of plated through holes or other electrical connecting means 68 are shown connecting plated element 58 to plated element 64. A further pair of plated through holes or other electrical connecting means 70 are shown connecting printed circuit portion 56 to portion 66. A plated through hole or electrical connecting means 72 connects portion 62 at a first end to a first end of portion 64. A further plated through hole or electrical connecting means 74 connects a first end of element 60 to a first end of element 66.

Figure 3:
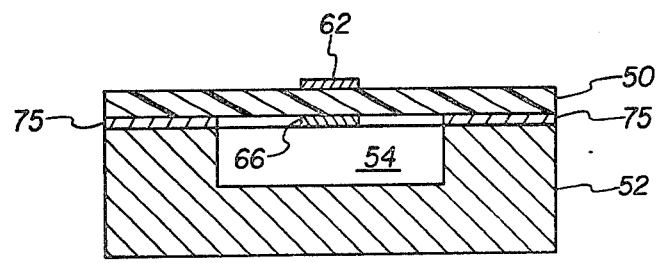
FIG. 3 is a cross-sectional view of a portion of FIG. 2.

FIG. 3 is a cross-section of FIG. 2 and, where applicable, identical numbers are used. In other words, the printed portions 62 and 66 are shown on the top and bottom of the dielectric 50 which is situated over an opening or hole 54 in base plane 52. Not shown in FIG. 2 but illustrated in FIG. 3, is additional base plane material 75 which is attached to the dielectric 50 to provide an additional and more consistently spaced base plane in all areas other than the cutout for stripline signal transmission over or through the conductive transmission paths.

It should be further noted that there are two discrete components in FIG. 2 comprising capacitors 76 and 78. Capacitor 76 has its leads connected between printed circuit portion 56 and printed circuit portion 62. The capacitor 78 is connected between the printed circuit portions 58 and 60. Both of these connections are made at points on the printed circuit portion which are reasonably close to each other.

The use of discrete components for the capacitors in combination with the printed circuit transmission elements allows the present inventive concept to provide signal coupling in a small amount of physical space while still providing the consistency between units that printed circuit technology allows.

OPERATION

The operation of the invention is substantially self-apparent from the detailed description above and an examination of the drawings. It should, however, be noted that the two pair of connecting elements designated as plated through holes 68 and 70 are for the purpose of reducing series inductance and could be replaced by a single electrical connection element in each instance. The twist in the conductors is effected at the midpoints or ends of the twisted conductors by the plated-through holes or connecting elements 72 and 74. This provides the required symmetry among the four signal ports at the edge of dielectric 50 of FIG. 2 for the conductors 56, 58, 60 and 62.

The conductors 60, 64, 66 and 62 on opposite sides of the dielectric 50 are mutually coupled in a primarily magnetic field sense as opposed to an electric field sense.

On the other hand, the capacitors 76 and 78 provide the coupling required between the leads in an electric field sense to complete the circuit operation. The chassis or mounting means 52 shown in FIG. 3 must have the relief shown as opening or space 54 to allow space for the mutual coupling of the magnetic fields.

The signal ports associated with the conductors shown in FIG. 2 operate in a stripline signal transmission mode in conjunction with the ground plane 75 as they leave the coupling area.

As explained previously, the purpose of the present inventive concept is to allow the operation of signal coupling in less space than is needed in typical quarter wavelength couplers using entirely distributed printed circuit techniques.

Although a single embodiment of the inventive concept has been illustrated, I wish to be limited not by the single embodiment shown but only by the scope of the appended claims wherein I claim:

1. Signal coupling apparatus comprising, in combination:
   dielectric means;
   transmission line first and second means juxtaposed each other on opposite sides of said dielectric means and each having first and second ends;
   transmission line third and fourth means juxtaposed each other on opposite sides of said dielectric means and each having first and second ends, said first and third transmission line means being on the same side of said dielectric means and said first ends of said first, second, third and fourth transmission line means being in close proximity;
   interconnect fifth means connecting said first end of said first means to said first end of said fourth means;
   interconnect sixth means connecting said first end of said second means to said first end of said third means, said interconnect means providing symmetry of coupling between associated transmission line means, the interconnection of said first through fourth means simulating a twisted pair of inductors;
   signal input seventh means physically attached to said one side of said dielectric means and electrically interconnected to said second means on the opposite side of said dielectric means;
   signal output eighth means physically attached to said one side of said dielectric means and electrically interconnected to said fourth means on the opposite side of said dielectric means;
   lumped element capacitance ninth means connected between said first means and said seventh means; and
   lumped element capacitance tenth means connected between said third means and said eighth means.

2. Signal coupling means comprising, in combination:
   dielectric means mounted on a base plane including a cavity;
   multiple section printed circuit transmission line means, one-half of said multiple sections being on opposite sides of said dielectric means and in the area of said cavity;
   interconnect means connecting all spaced apart sections of said transmission line means together to effect simulation of twisted wire magnetic field coupling, the total electrically effective length of the twisted wire coupling being substantially less than $\frac{1}{4}$ wavelength of the signal being coupled, the sections being physically spaced apart although electrically interactive; and
   capacitive means connected between the twisted pair of wires at each end of said transmission line means for providing electric field coupling.

3. The method of reducing printed circuit quadrature signal coupler size comprising, the steps of:
   electrically connecting and magnetically coupling a multiplicity of juxtaposed printed conductor elements situated on opposite sides of a dielectric means over a cavity in a base plane to effect a twisted wire pair by connection of the elements through the dielectric means; and
   electrically coupling the ends of the twisted wire pair by lumped constant capacitive means to form a hybrid signal coupler.

* * * * *